US 10,644,073 B2

(12) United States Patent
Lee et al.

(10) Patent No.: US 10,644,073 B2
(45) Date of Patent: May 5, 2020

(54) IMAGE SENSORS AND ELECTRONIC DEVICES INCLUDING THE SAME

(71) Applicant: Samsung Electronics Co., Ltd., Suwon-si, Gyeonggi-do (KR)

(72) Inventors: Kwang Hee Lee, Hwaseong-si (KR); Gae Hwang Lee, Seongnam-si (KR); Dong-Seok Leem, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/843,364

(22) Filed: Dec. 15, 2017

(65) Prior Publication Data

US 2018/0175114 A1  Jun. 21, 2018

(30) Foreign Application Priority Data

Dec. 19, 2016  (KR) .......................... 10-2016-0173550

(51) Int. Cl.
  *H01L 27/30* (2006.01)
  *H04N 9/04* (2006.01)
  (Continued)

(52) U.S. Cl.
  CPC .......... *H01L 27/307* (2013.01); *H04N 5/378* (2013.01); *H04N 9/045* (2013.01); *H04N 9/07* (2013.01);
  (Continued)

(58) Field of Classification Search
  CPC ............... H01L 27/307; H01L 27/1461; H01L 27/14647
  See application file for complete search history.

(56) References Cited

U.S. PATENT DOCUMENTS

| 3,971,065 A | 7/1976 | Bayer |
| 5,323,233 A | 6/1994 | Yamagami et al. |

(Continued)

FOREIGN PATENT DOCUMENTS

| JP | 2015/015332 A | 1/2015 |
| JP | 2015/015684 A | 1/2015 |

(Continued)

*Primary Examiner* — Thao X Le
*Assistant Examiner* — Laura M Dykes
(74) *Attorney, Agent, or Firm* — Harness, Dickey & Pierce, P.L.C.

(57) ABSTRACT

An image sensor may include an organic photo-sensing device configured to selectively sense first visible light and a photo-sensing device array including a first photo-sensing device configured to selectively sense second visible light, a second photo-sensing device configured to selectively sense third visible light, and a third photo-sensing device configured to selectively sense mixed light of the second visible light and the third visible light. The image sensor may include a color filter array including a first color filter configured to selectively transmit the second visible light, a second color filter configured to selectively transmit the third visible light, and a third color filter configured to transmit mixed light of the second visible light and the third visible light. At least the first photo-sensing device and the second photo-sensing device may be at different depths in a substrate and may be laterally offset from each other.

14 Claims, 22 Drawing Sheets

(51) Int. Cl.
    *H04N 9/07*      (2006.01)
    *H04N 5/378*      (2011.01)
    *H01L 27/146*      (2006.01)
    *H04N 5/374*      (2011.01)

(52) U.S. Cl.
    CPC ...... *H01L 27/1461* (2013.01); *H01L 27/1464* (2013.01); *H01L 27/14621* (2013.01); *H01L 27/14647* (2013.01); *H04N 5/374* (2013.01); *H04N 2209/042* (2013.01)

(56) References Cited

U.S. PATENT DOCUMENTS

| | | | |
|---|---|---|---|
| 6,476,865 B1 | 11/2002 | Gindele et al. | |
| 8,035,708 B2 | 10/2011 | Takizawa et al. | |
| 8,427,563 B2 | 4/2013 | Kim et al. | |
| 8,670,054 B2 | 3/2014 | Takizawa | |
| 8,963,267 B2 | 2/2015 | Kokubun et al. | |
| 9,006,566 B2 | 4/2015 | Ihama | |
| 9,793,324 B2 | 10/2017 | Joei | |
| 2006/0201546 A1* | 9/2006 | Yokoyama | H01L 27/14621 136/263 |
| 2008/0246853 A1* | 10/2008 | Takizawa | H01L 27/14621 348/222.1 |
| 2010/0053385 A1* | 3/2010 | Choe | H04N 5/35563 348/273 |
| 2010/0141771 A1* | 6/2010 | Hu | H01L 27/14621 348/164 |
| 2011/0317048 A1* | 12/2011 | Bai | H01L 27/1461 348/294 |
| 2013/0062512 A1* | 3/2013 | Hu | H01L 27/14601 250/226 |
| 2014/0138665 A1 | 5/2014 | Takizawa | |
| 2014/0375826 A1* | 12/2014 | Lee | H01L 27/307 348/207.1 |
| 2015/0255498 A1 | 9/2015 | Sugiura | |
| 2016/0249025 A1 | 8/2016 | Aruga | |
| 2017/0358614 A1* | 12/2017 | Azami | H01L 27/14605 |

FOREIGN PATENT DOCUMENTS

| | | |
|---|---|---|
| JP | 2015/028960 A | 2/2015 |
| KR | 101500344 B1 | 3/2015 |

* cited by examiner

IMAGE SENSORS AND ELECTRONIC DEVICES INCLUDING THE SAME

CROSS-REFERENCE TO RELATED APPLICATIONS

This application claims priority to and the benefit of, under 35 U.S.C. § 119, Korean Patent Application No. 10-2016-0173550 filed in the Korean Intellectual Property Office on Dec. 19, 2016, the entire contents of which are incorporated herein by reference.

BACKGROUND

1. Field

Image sensors electronic devices including the same are disclosed.

2. Description of the Related Art

An image sensor for photographing ("configured to photograph") an object and storing ("configured to store") a thus-obtained image as an electrical signal may be employed ("included") in an electronic device. Such an electronic device may be a digital camera, a mobile phone camera, a PC camera, a camcorder, some combination thereof, or the like. An image sensor may decompose introduced light (e.g., light that is incident on and thus received by the image sensor) depending on wavelengths of the introduced light. The image sensor may convert thus-obtained components, obtained based on decomposing one or more wavelength spectra of the introduced light, into one or more electrical signals.

Image sensors increasingly need to be downsized.

Recently, image sensors having a stacked structure have been researched to arrive at image sensors having a reduced size.

SUMMARY

Some example embodiments provide an image sensor having a novel stack structure such that the image sensor is configured to have improving sensitivity based on said novel stack structure.

Some example embodiments provide an electronic device including the image sensor.

According to some example embodiments, an image sensor may include a repeating assembly of a plurality of photo-sensing devices and a color filter array. The repeating assembly may include an organic photo-sensing device configured to selectively sense a first wavelength spectrum of visible light, and a photo-sensing device array including at least one first photo-sensing device configured to selectively sense a second wavelength spectrum of visible light, at least one second photo-sensing device configured to selectively sense a third wavelength spectrum of visible light, and at least one third photo-sensing device configured to selectively sense a mixed wavelength spectrum of light of the second wavelength spectrum of visible light and the third wavelength spectrum of visible light. The color filter array may include at least one first color filter between the organic photo-sensing device and the first photo-sensing device and configured to selectively transmit the second wavelength spectrum of visible light, at least one second color filter between the organic photo-sensing device and the second photo-sensing device and configured to selectively transmit the third wavelength spectrum of visible light, and at least one third color filter between the organic photo-sensing device and the third photo-sensing device and configured to transmit the mixed wavelength spectrum of light of the second wavelength spectrum of visible light and the third wavelength spectrum of visible light.

The third color filter may be a complementary color filter of the first wavelength spectrum of visible light.

The third color filter may be a white color filter.

A quantity of filters of the at least one third color filter may be equal to or fewer than a total quantity of filters of the first color filter and the second color filter.

The first wavelength spectrum of visible light may be green light, and the photo-sensing device array may include common quantities of first photo-sensing devices and second photo-sensing devices.

The third photo-sensing device may extend from a depth in a substrate associated with an absorption region of the second wavelength spectrum of visible light to a separate depth in the substrate associated with an absorption region of the third wavelength spectrum of visible light.

The third photo-sensing device may be configured to absorb the first wavelength spectrum of visible light.

The first photo-sensing device and the second photo-sensing device may be at different depths in a substrate.

The first wavelength spectrum of visible light may be blue light or red light, and the first photo-sensing device and the second photo-sensing device may have different depths in a substrate.

The third photo-sensing device may extend from a depth in the substrate associated with an absorption region of the second wavelength spectrum of visible light to a separate depth in the substrate associated with an absorption region of the third wavelength spectrum of visible light.

The first photo-sensing device and the second photo-sensing device may be at different depths in a substrate, and the third photo-sensing device may extend from a depth in the substrate associated with an absorption region of the second wavelength spectrum of visible light to a separate depth in the substrate associated with an absorption region of the third wavelength spectrum of visible light.

The image sensor may include a readout circuit layer and a light-receiving layer on one surface of a substrate on which the photo-sensing device array is located.

The image sensor may include a readout circuit layer and a light-receiving layer on an opposite surface of a substrate on which the photo-sensing device array is located.

An electronic device may include the image sensor.

According to some example embodiments, an image sensor may include an organic photo-sensing device configured to selectively sense a first wavelength spectrum of visible light, and a photo-sensing device array. The photo-sensing device array may include at least one first photo-sensing device configured to selectively sense a second wavelength spectrum of visible light, at least one second photo-sensing device configured to selectively sense a third wavelength spectrum of visible light, and at least one third photo-sensing device configured to selectively sense a mixed wavelength spectrum of light of at least the first wavelength spectrum of visible light and at least one wavelength spectrum of visible light of the second wavelength spectrum of visible light and the third wavelength spectrum of visible light.

The image sensor may further include a color filter array including at least one first color filter configured to selectively transmit the second wavelength spectrum of visible light, at least one second color filter configured to selectively transmit the third wavelength spectrum of visible light, and at least one third color filter configured to transmit the mixed wavelength spectrum of light of the second wavelength spectrum of visible light and the third wavelength spectrum of visible light.

The organic photo-sensing device may be between the color filter array and the photo-sensing device array.

At least the at least one first photo-sensing device and the at least one second photo-sensing device may be at different depths in a substrate and may be laterally offset from each other, and the at least one third photo-sensing device may at least partially extend between the different depths.

The third photo-sensing device may extend from a depth in the substrate associated with an absorption region of the second wavelength spectrum of visible light to a separate depth in the substrate associated with an absorption region of the third wavelength spectrum of visible light.

The at least one third photo-sensing device may extend from a depth in the substrate associated with an absorption region of the second wavelength spectrum of visible light to a separate depth in the substrate associated with an absorption region of the third wavelength spectrum of visible light.

As the photo-sensing device may be formed in a two-layered structure, the light-receiving area may be improved in two times of the single-layered structure image sensor, or the integration may be improved in two times when the photo-receiving area is maintained equal to the image sensor having the single-layered structure.

A high sensitive image sensor may be provided by further including a photo-sensing device of a mixed light and further including a mixed light filter, so as to improve luminance.

DETAILED DESCRIPTION

Figure 1:
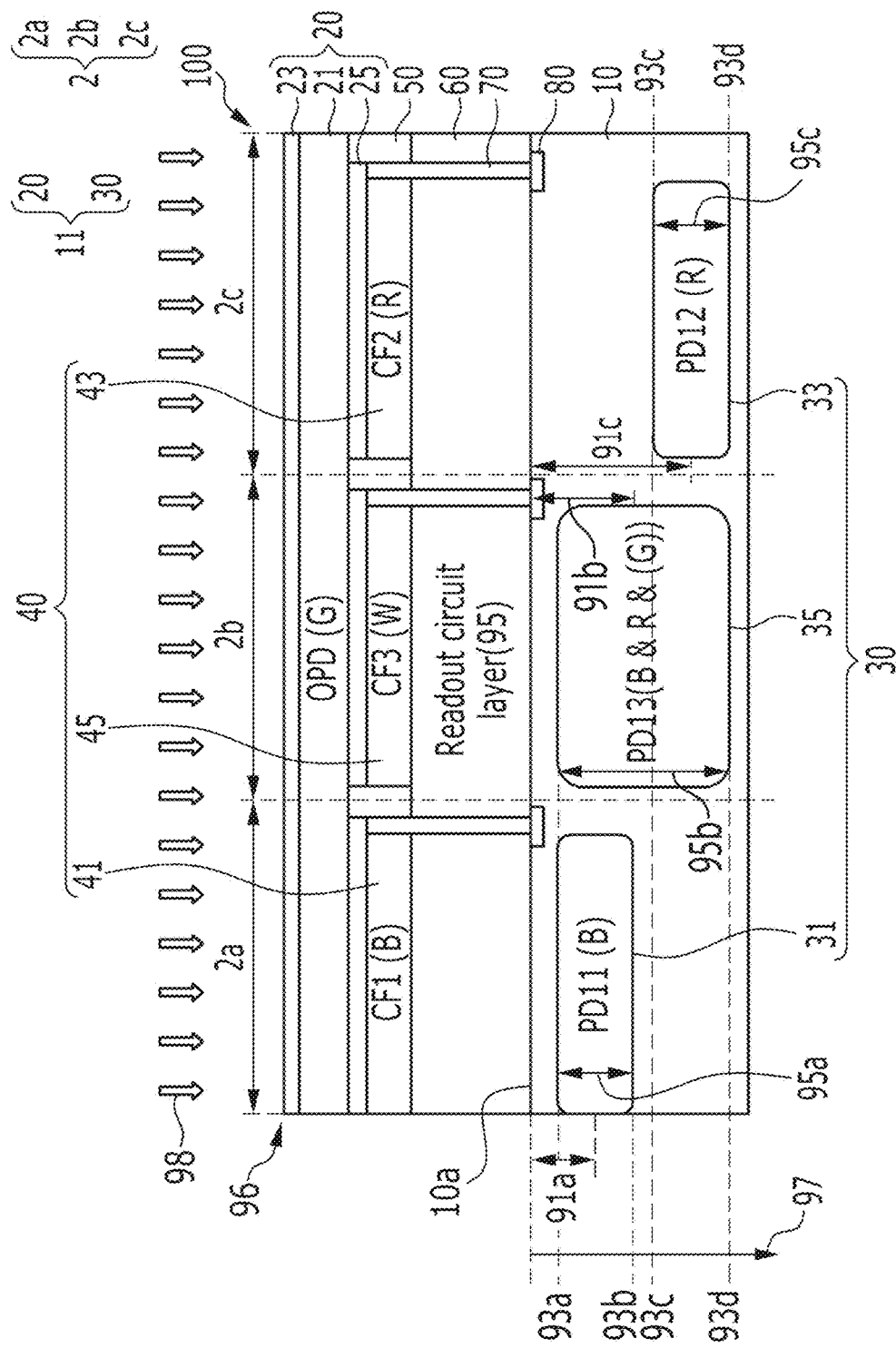
FIG. 1 is a cross-sectional view showing an image sensor according to some example embodiments.

Hereinafter, example embodiments will be described in detail so that a person skilled in the art would understand the same.

This disclosure may, however, be embodied in many different forms and is not construed as limited to the example embodiments set forth herein.

In the drawings, the thickness of layers, films, panels, regions, etc., are exaggerated for clarity.

Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present. Furthermore, when an element is referred to as being "on" another element, it will be understood that the element may be above or below the other element.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, an image sensor according to some example embodiments is described with reference to drawings.

As an example of an image sensor, an organic complementary metal-oxide-semiconductor (CMOS) image sensor is described.

FIG. 1 is a cross-sectional view of an image sensor according to some example embodiments.

Referring to FIG. 1, the image sensor 100 according to some example embodiments is a stacked image sensor having an array of pixels 2 and having a stacked structure in which photo-sensing devices are stacked in two layers.

A repeating assembly 11 of the stacked structure at least includes an organic photo-sensing device 20 and a photo-sensing device array 30 which are vertically stacked. As shown in at least FIG. 1, the substrate 10 may be integrated with photo-sensing devices 31, 33, and 35 of the photo-sensing device array 30, such that the photo-sensing devices 31, 33, and 35 are encompassed (partially or entirely) within a volume defined by the outer surfaces of the substrate 10.

The organic photo-sensing device 20 includes an organic photoelectric conversion layer 21 configured to selectively sense a light in a first wavelength spectrum of visible light (hereinafter, referring to 'first visible light'), which is a part of the wavelength spectrum of the visible light 98 received at an incident light proximate side 96 of the image sensor 100 (e.g., the "incident light"), and a first electrode 23 and a second electrode 25 disposed on both ("opposite") surfaces of the organic photoelectric conversion layer 21.

FIG. 1 exemplifies a green light having a maximum absorption wavelength ($\lambda_{max}$) at about 500 nm to about 600 nm as an example of the first visible light.

The first visible light may be a green light having a maximum absorption wavelength, for example, at about 520 nm to about 580 nm within the wavelength spectrum of visible light.

The organic photoelectric conversion layer 21 may include a p-type semiconductor and an n-type semiconductor and the p-type semiconductor and the n-type semiconductor form a pn junction.

The organic photoelectric conversion layer 21 may selectively absorb first visible light to generate excitons, the generated excitons may be separated into holes and electrons, the separated holes may be transported to an anode that is one of the first electrode 23 and the second electrode 25, and separated electrons may be transported to a cathode that is one of the first electrode 23 and the second electrode 25 to incur photoelectric conversion effects.

At least one of the p-type semiconductor and the n-type semiconductor may selectively absorb first visible light.

The p-type semiconductor and the n-type semiconductor may independently include an organic material, an inorganic material, or an organic/inorganic material.

At least one of the p-type semiconductor and the n-type semiconductor may include an organic material.

The organic photoelectric conversion layer 21 may be a single layer or a multilayer.

The organic photoelectric conversion layer 21 may be for example various combinations of an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a volume ratio of about 1:100 to about 100:1.

The p-type semiconductor and the n-type semiconductor may be mixed in a volume ratio of about 1:50 to about 50:1, about 1:10 to about 10:1, or about 1:1.

When the p-type semiconductor and the n-type semiconductor have a composition ratio within the range, an exciton may be effectively produced and a pn junction may be effectively formed.

The p-type layer may include the p-type semiconductor and the n-type layer may include the n-type semiconductor.

The organic photoelectric conversion layer 21 may have a thickness of about 1 nm to about 500 nm for example, about 5 nm to about 300 nm or about 5 nm to about 200 nm.

Within the above thickness range, the organic photoelectric conversion layer 21 may effectively absorb first visible light, effectively separate holes from electrons, and transport them, thereby effectively improving photoelectric conversion efficiency.

One of the first electrode 23 and the second electrode 25 is an anode and the other is a cathode.

Both of the first electrode 23 and the second electrode 25 may be a transparent electrode, and the transparent electrode may be made of, for example, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

The organic photoelectric conversion layer 21 may selectively absorb first visible light.

The organic photoelectric conversion layer 21 may selectively absorb first visible light and may transmit light except the first visible light.

The organic photoelectric conversion layer 21 may be formed on a whole ("entire") surface of the image sensor 100.

Thus, the organic photoelectric conversion layer 21 may selectively absorb the first visible light on the whole surface of the image sensor and may increase the light area of the organic photo-sensing device 20, so as to enhance a light-absorptive efficiency of the organic photo-sensing device 20.

A through via 70 configured to discharge charges collected in the organic photoelectric conversion layer 21 is connected to the second electrode 25 patterned in each pixel 2a, 2b, 2c of the array of pixels 2.

The through via 70 is covered with an insulation layer (not shown) and is filled with a charge conductive material (not shown) in the inside thereof, and it is disposed in a first insulation layer 50 and a second insulation layer 60.

The first insulation layer 50 and the second insulation layer 60 may be made of an inorganic insulating material such as silicon oxide and/or silicon nitride or a low dielectric constant (low K) material such as SiC, SiCOH, SiCO, and SiOF.

The light except the first visible light passing through the organic photo-sensing device 20 is photoelectrically conversed by the photo-sensing device array 30 under the organic photo-sensing device 20.

The photo-sensing device array 30 includes at least one first photo-sensing device (PD11(B), 31) configured to selectively sense second visible light except first visible light and third visible light, at least one second photo-sensing device (PD12(R), 33) configured to selectively sense third visible light except the first visible light and the second visible light, and at least at least one third photo-sensing device (PD13(B&R), 35) configured to selectively sense a mixed wavelength spectrum of light of at least the first wavelength spectrum of visible light and at least one wavelength spectrum of visible light of the second wavelength spectrum of visible light and the third wavelength spectrum of visible light. As shown in at least FIG. 1, the photo-sensing devices 31, 33, 35 of the photo-sensing device array 30 may be laterally offset from each other, such that the photo-sensing devices 31, 33, and 35 do not vertically overlap. As shown in FIG. 1, for example, the photo-sensing devices 31, 33, and 35 are in separate pixels 2a, 2b, 2c of the array of pixels 2. As used herein, "sense" and "absorb" may be used interchangeably, such that a photo-sensing device configured to selectively sense a wavelength spectrum of light may be understood to be configured to selectively absorb the wavelength spectrum of light.

In some example embodiments, a photo-sensing device, including one or more of the photo-sensing devices 31, 33, and 35, may be configured to sense a particular wavelength spectrum of light. Separate photo-sensing devices (e.g., photo-sensing devices 31, 33, and 35) may be configured to sense different wavelength spectra of light. One or more photo-sensing devices may be configured to sense a particular wavelength spectrum of light (e.g., red wavelength spectrum of light, blue wavelength spectrum of light, green wavelength spectrum of light, mixed wavelength spectrum of light, etc.) in an absence of the color filter array 40. For example, the one or more photo-sensing devices may be configured to sense a limited portion of the entire wavelength spectrum of light that is received at ("incident on") the one or more photo-sensing devices.

Each of photo-sensing devices 31, 33, and 35 may be a photodiode.

When the first visible light is a green light ("green wavelength spectrum of light"), the second visible light may be a blue light having a maximum absorption wavelength ($\lambda_{max}$) at greater than or equal to about 400 nm to less than about 500 nm.

The second visible light may be a blue light ("blue wavelength spectrum of light") having a maximum absorption wavelength, for example, at about 420 nm to about 480 nm within the range.

The third visible light may be a red light ("red wavelength spectrum of light") having a maximum absorption wavelength ($\lambda_{max}$) at greater than about 600 nm and less than or equal to about 700 nm.

The third visible light may be a red light having a maximum absorption wavelength, for example, at about 630 nm to about 680 nm within the range.

When the photo-sensing devices 31, 33, and 35 are formed in the silicon semiconductor substrate 10, for example as shown in FIG. 1, the blue light received at the upper surface 10a of the substrate 10 is absorbed within a depth 97 from the upper surface 10a into the substrate 10 of about 1 μm, and the red light is absorbed in a depth 97 of about 6 μm.

Thus, the first photo-sensing device 31 configured to selectively absorb the blue light may be formed such that the first photo-sensing device 31 is located within the substrate 10 at a depth 97 from upper surface 10a that is centered at a depth 91a of about 1 μm from the upper surface 10a of the semiconductor substrate 10 and is thus located between depths 93a and 93b based on the thickness 95a of the first photo-sensing device 31, and the second photo-sensing device 33 configured to selectively absorb the red light may be formed such that the second photo-sensing device 33 is located within the substrate 10 at a depth 97 from upper surface 10a that is centered at a depth 91c of about 6 μm and is thus located between depths 93c and 93d based on the thickness 95c of the second photo-sensing device 33.

When the first photo-sensing device 31 is formed in a different depth 97 from the upper surface of the substrate 10, relative to the depth 97 of the second photo-sensing device 33 from the upper surface 10a of the substrate 10 (e.g., depths 91a and 91c are different depths), the selectivity to a color corresponding to each photo-sensing device may be enhanced, so as to improve the color separation characteristics of the image sensor 100.

The third photo-sensing device 35 configured to absorb the mixed color ("mixed light") may be formed such that the third photo-sensing device 35 is located within the substrate 10 at a depth 97 from upper surface 10a that is centered at depth 91b and extends from the blue light absorption region depth 93a to the red light absorption region depth 93d based on the thickness 95b of the third photo-sensing device 35. Thus, the third photo-sensing device 35 at least partially extends between the different depths 97 at which photo-sensing devices 31 and 33 are located in the substrate 10.

As the third photo-sensing device 35 is formed to extend from the blue light absorption region represented by at least the region of substrate 10 between depths 93a and 93b to the red light absorption region represented by at least the region of substrate 10 between depths 93c and 93d, so the third photo-sensing device 35 may absorb even the green light in addition to the blue light and the red light.

Thus the third photo-sensing device 35 may absorb even the remained green light which was not sufficiently absorbed by the organic photo-sensing device 20, so the third photo-sensing device may enhance sensitivity of the image sensor.

Particularly, the third photo-sensing device 35 may improve sensitivity at a low light level.

The organic photo-sensing device 20 and the photo-sensing device array 30 may sense the light entered through a light-receiving layer 90, and a readout circuit layer 95 may read the sensed information.

When the image sensor 100 is formed in a front side illumination type as illustrated in FIG. 1, the readout circuit layer 95 for reading the sensed information in the organic photo-sensing device 20 and the photo-sensing device array 30 may be formed in the second insulation layer 60.

The color filter array 40 may be omitted as needed, and one or more of the photo-sensing devices 31, 33, 35 may be configured to sense a particular wavelength spectrum of light, and thus be configured to selectively sense a particular wavelength spectrum of light (e.g., red light, blue light, green light, mixed light, etc.) in the absence of the color filter array 40.

As referred to herein, "red light" or light in a "red wavelength spectrum of light" may include light having a wavelength spectrum with a maximum absorption wavelength ($\lambda_{max}$) in a range of greater than about 600 nm to less than or equal to about 700 nm. For example, color filter 43 may be a red filter configured to selectively transmit red light having a wavelength spectrum with a maximum absorption wavelength ($\lambda_{max}$) in a range of greater than about 600 nm to less than or equal to about 700 nm.

As referred to herein, "blue light" or light in a "blue wavelength spectrum of light" may include light having a wavelength spectrum with a maximum absorption wavelength ($\lambda_{max}$) in a range of greater than or equal to about 400 nm to less than or equal to about 500 nm. For example, color filter 41 may be a blue filter configured to selectively transmit blue light having a wavelength spectrum with a maximum absorption wavelength ($\lambda_{max}$) in a range of greater than or equal to about 400 nm to less than or equal to about 500 nm.

As referred to herein, "green light" or light in a "green wavelength spectrum of light" may include light having a wavelength spectrum with a maximum absorption wavelength ($\lambda_{max}$) in a range of about 500 nm to about 600 nm. For example, color filter 45 may be a green filter configured to selectively transmit green light having a wavelength spectrum with a maximum absorption wavelength ($\lambda_{max}$) in a range of about 500 nm to about 600 nm.

FIG. 1 illustrates a method how electrons and/or holes separated by the organic photo-sensing device 20 are collected in the electron storage 80 and then transmitted to a floating diffusion (not shown) through a transmitting gate (not shown) of the readout circuit layer 95.

However, if required, the transmitting gate may be omitted, and the through via 70 may be directly connected to a gate of an amplifying transistor.

According to some example embodiments, the color separation may be accomplished by differentiating depths 97 of the first photo-sensing device 31 for the blue light absorption, the second photo-sensing device 33 for the red light absorption, and the third photo-sensing device 35 for the mixed light absorption.

However, in order to effectively accomplish the color separation of the first to third photo-sensing devices 31, 33, and 35 which are horizontally disposed, the image sensor 100 may further include a color filter array 40.

The color filter array 40 includes a first color filter 41 disposed between the organic photo-sensing device 20 and the first photo-sensing device 31 and selectively transmitting the first visible light; a second color filter 43 disposed between the organic photo-sensing device 20 and the second photo-sensing device 33 and selectively transmitting the second visible light; and a third color filter 45 transmitting a mixed light of the first visible light and the second visible light.

The color filter array 40 includes a plurality of unit color filter arrays which is repeatedly arranged along with a row and a column, and the unit color filter array may have a variety of matrix arrays, for example, 2×2, 3×3 and the like, and the array is corresponded to the array 30 of each photo-sensing device 31, 33, and 35.

FIGS. 2 to 5 are schematic views showing a color filter array 40 and an organic photo-sensing device 20.

Figure 2:
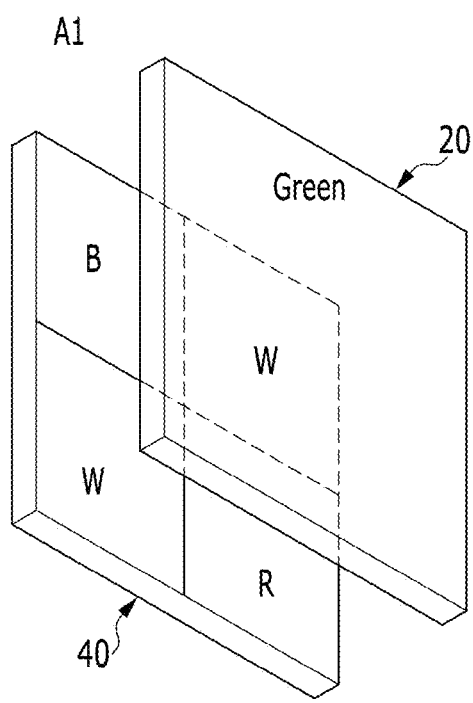
FIG. 2, FIG. 3, FIG. 4, and FIG. 5 are schematic views showing various examples for color filter arrays of an image sensor according to some example embodiments.
Figure 3:
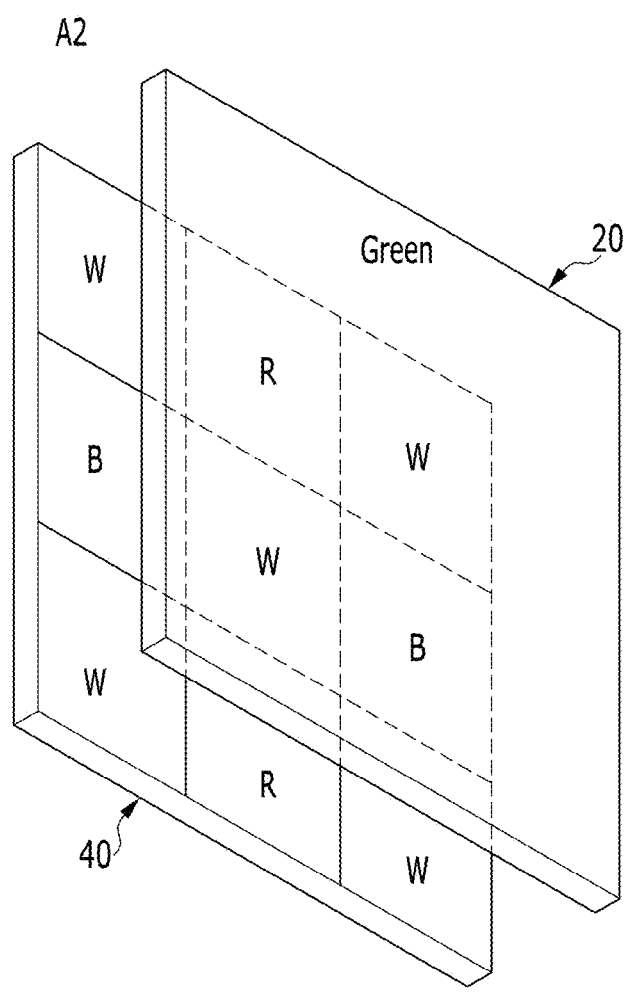
Figure 4:
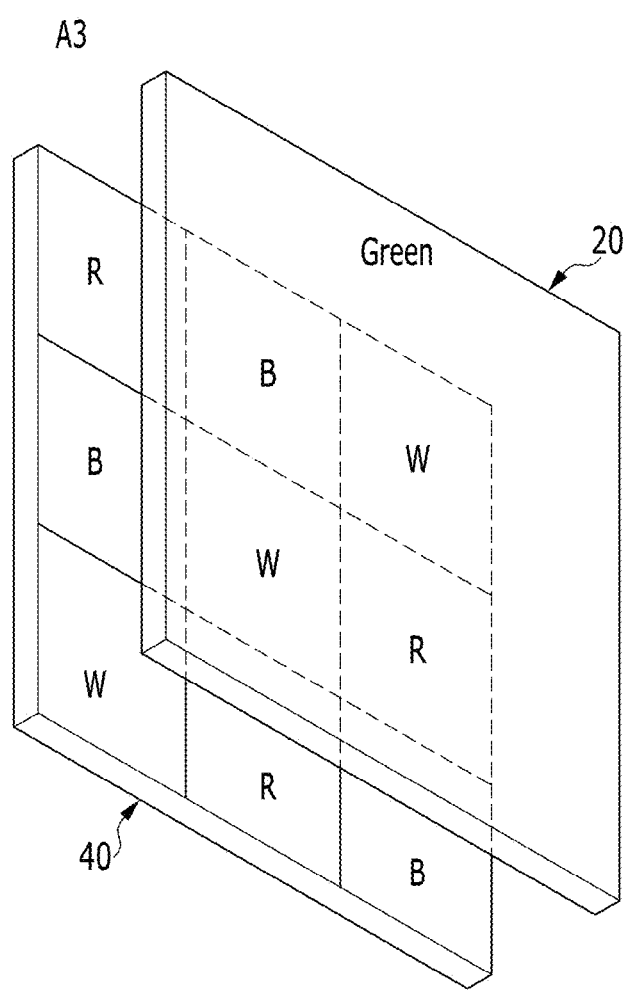
Figure 5:
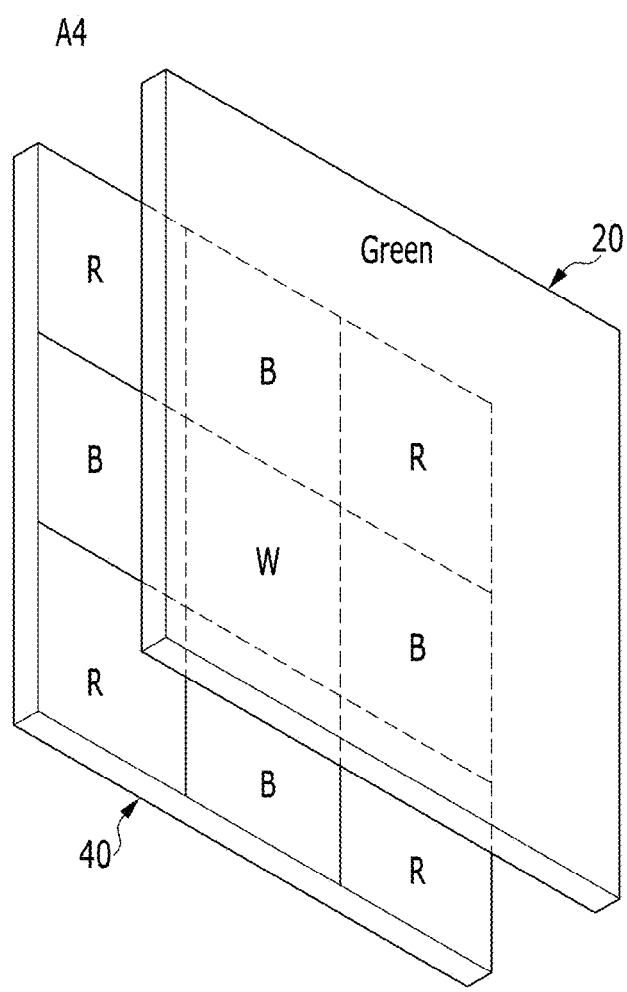

FIG. 2 shows a color filter array 40 having a 2×2 matrix format; and FIG. 3 to FIG. 5 show color filter arrays 40 having a 3×3 matrix format.

Referring to FIGS. 2 to 5, the number ("quantity") of a blue filter B is same as the number of a red filter R, and they are symmetrically disposed in the color filter array 40, and a white color filter W transmitting a mixed light of blue and red may be disposed in the other regions.

The white color filter W control a spectrum in a blue region contacted with ultraviolet (UV) and a red region contacted with infrared ray (IR).

Accordingly, when the white color filter W is formed, it is easy to carry out the image signal processing, compared to the case when the white color filter W is not formed, since it matches absorption spectrums of the adjacent first photo-sensing device PD11(B), 31 and the adjacent second photo-sensing device PD12(R), 33.

In addition, when the white color filter W is not formed, it is stepped with the adjacent blue filter B and red filter R, so the step is unfavorably formed also in the organic photo-sensing device (G).

The number of the white color filter W is same as or less than the total number of the blue filter (B) and the red filter (R). Restated, a quantity of filters of at least one third color filter may be equal to or fewer than a total quantity of filters of a first color filter and a second color filter.

If it follows the conditions, the alignments shown in FIGS. 2 to 5 may be variously changed.

The white color filter W may have a merit of improving sensitivity at a low light level, but it may cause an adverse effect of deteriorating the color separation characteristics if the number of the white color filter W is getting increased.

For example, when the organic photo-sensing device 20 selectively absorbs green, the other two colors, which are blue and red, may be separated by the lower photo-sensing devices 31, 33.

In other words, in order to maintain the color separation characteristics, at least half or more of the lower photo-sensing devices 31+33 may be photo-sensing devices absorbing single color.

Thus as the number of the white color filter W may be same or less than the total numbers of the blue filter B and the red filter R, it may achieve two effects of maintaining the color separation characteristics and also enhancing the sensitivity at a low light level.

The blue filter B may be a filter selectively transmitting blue light having a maximum absorption wavelength ($\lambda_{max}$) at greater than or equal to about 400 nm and less than about 500 nm.

The red filter R may be a filter selectively transmitting red light having a maximum absorption wavelength ($\lambda_{max}$) at greater than about 600 nm and less than or equal to about 700 nm.

FIGS. 2 to 5 illustrate a white color filter W, but a magenta (Mg) filter blocking green absorbed by the organic photo-sensing device 20 and selectively transmitting magenta light which is a complementary color to green may be used instead of the white color filter W.

The image sensor according to some example embodiments has a two-layered structure that the organic photo-sensing device and the photo-sensing device array are stacked in two layers, so a light-receiving area is increased in two times compared to the single-layered structure, or the integration may be improved in two times when the light-receiving area is maintained equivalent to that of the image sensor having the single-layered structure.

In addition, as the image sensor according to some example embodiments further includes a photo-sensing device of a mixed color, the light passing through the organic photo-sensing device is completely absorbed, so the sensitivity (light sensing sensitivity) is improved to provide a high sensitive image sensor.

Particularly, it may prevent that the sensitivity of the image sensor is sharply deteriorated even in an environment at a low light level and may accomplish high sensitivity characteristics.

Figure 6:
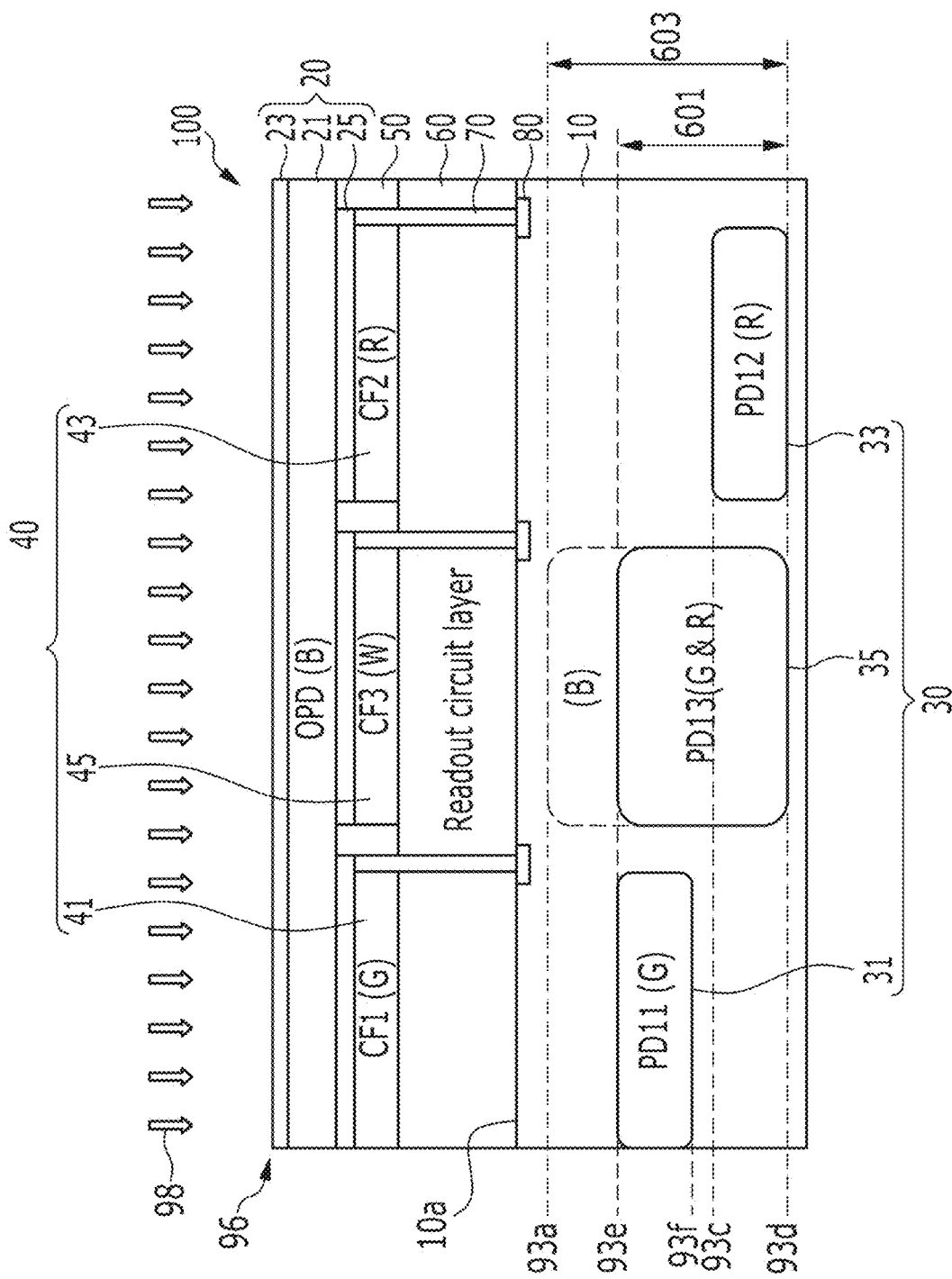
FIG. 6 is a cross-sectional view showing an image sensor according to some example embodiments.
Figure 7:
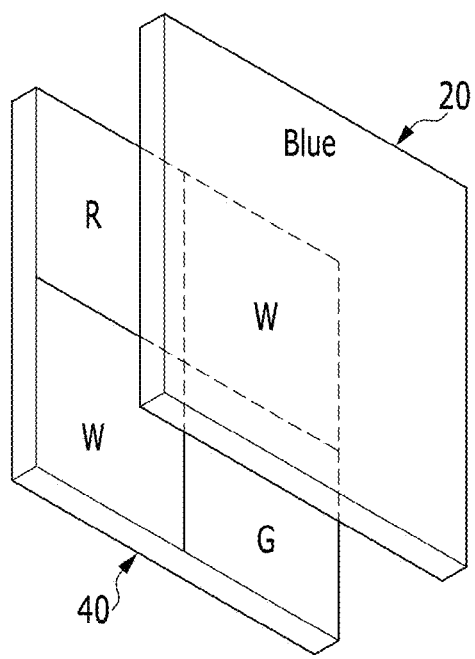
FIG. 7, FIG. 8, FIG. 9, and FIG. 10 are schematic views showing various examples for color filter arrays of an image sensor according to some example embodiments.
Figure 8:
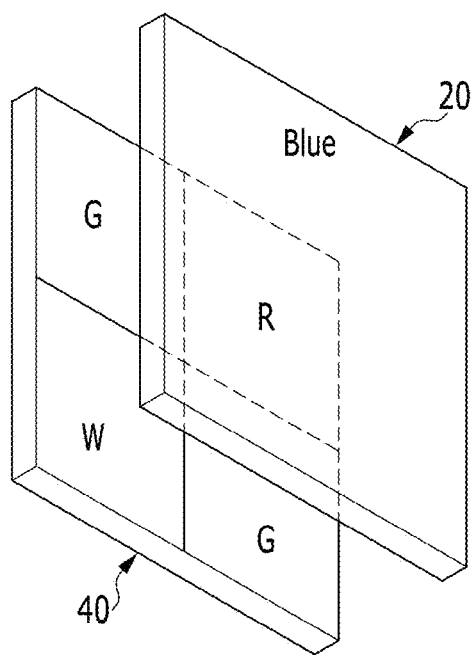
Figure 9:
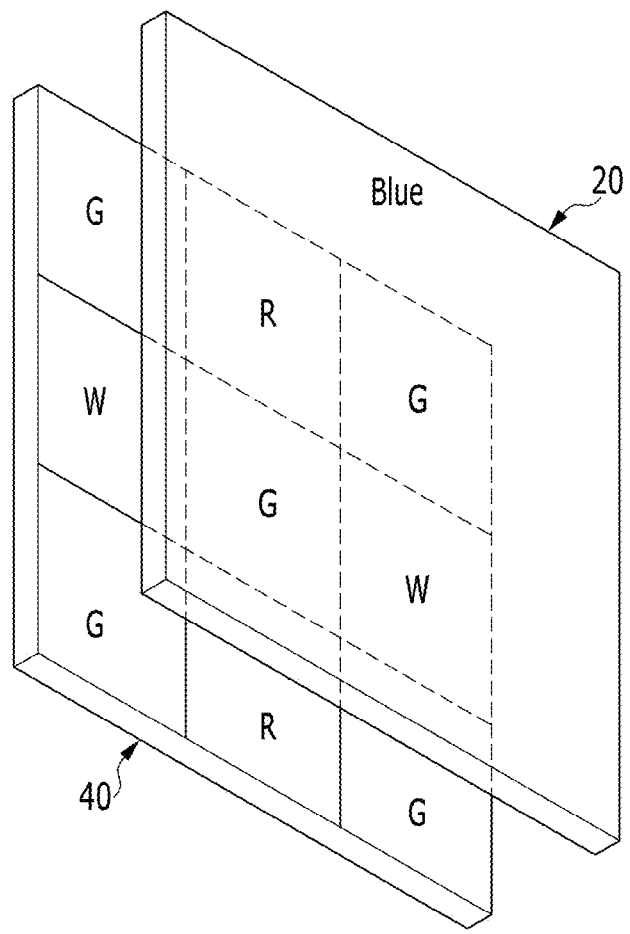
Figure 10:
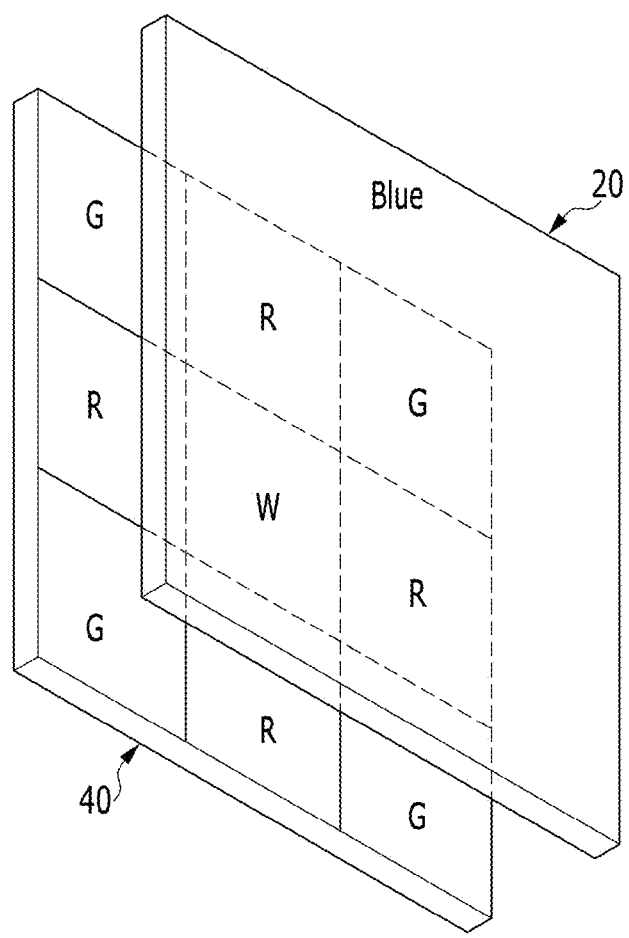

FIG. 6 is a cross-sectional view showing an image sensor according to some example embodiments when the first visible light sensed by the organic photo-sensing device 20 is a blue light.

When the first visible light is a blue light, a first photo-sensing device PD11(G), 31 of the photo-sensing device array 30 is formed to sense a green light, a second photo-sensing device PD12(R), 33 is formed to sense a red light, and a third photo-sensing device PD13(G&R), 35 is formed to sense a mixed light of green and red, based on the respective depth 97 regions through which the photo-sensing devices respectively extend.

The green light is absorbed in a depth 97 until about 3 μm of silicon semiconductor substrate 10 (e.g., between depths 93e and 93f), and the red light in a depth 97 until about 6 μm (e.g., between depths 93c and 93d).

Accordingly, the first photo-sensing device 31 configured to absorb the green light is formed in a depth 97 until about 3 μm from the upper surface 10a of the semiconductor substrate 10 (e.g., between depths 93e and 93f), and the second photo-sensing device 33 absorbing the red light is formed in a depth 97 until about 6 μm (e.g., between depths 93c and 93d).

The third photo-sensing device 35 absorbing the mixed light may be formed extending from the green light absorption region to the red light absorption region (e.g., between depths 93e and 93d) based on having a thickness 601. Thus, the third photo-sensing device 35 at least partially extends between the different depths 97 at which photo-sensing devices 31 and 33 are located in the substrate 10.

If required, the third photo-sensing device 35 absorbing the mixed light may be extended in thickness from thickness 601 to thickness 603 until the blue light absorption region (dotted line portion) (e.g., between depths 93a and 93d).

The color filter array 40 may have a variety of matrix such as 2×2, 3×3 and the like, as shown in FIGS. 7 to 10.

Referring to FIGS. 7 to 10, the number of the green filter G is same as the number of the red filter R in the color filter array 40, or the number of the green filter G is greater than the number of red filter R.

A white color filter W transmitting a mixed color of green and red may be disposed in the other regions. As long as satisfying the conditions, the alignments of FIGS. 7 to 10 may be variously changed.

The total number of the white color filter W transmitting a mixed light may be same as the total number of the other single color filters G, R or less than the total number of the other single color filters G, R.

The green filter G may be a filter selectively transmitting a green light having a maximum absorption wavelength ($\lambda_{max}$) at about 500 nm to about 600 nm.

The red filter R may be a filter selectively transmitting a red light having a maximum absorption wavelength ($\lambda_{max}$) at greater than about 600 nm and less than or equal to about 700 nm.

FIGS. 7 to 10 exemplify a white color filter W, but a yellow filter Y blocking blue absorbed by the organic photo-sensing device 20 and transmitting yellow light which is a complementary color to blue may be used instead of the white color filter W.

Figure 11:
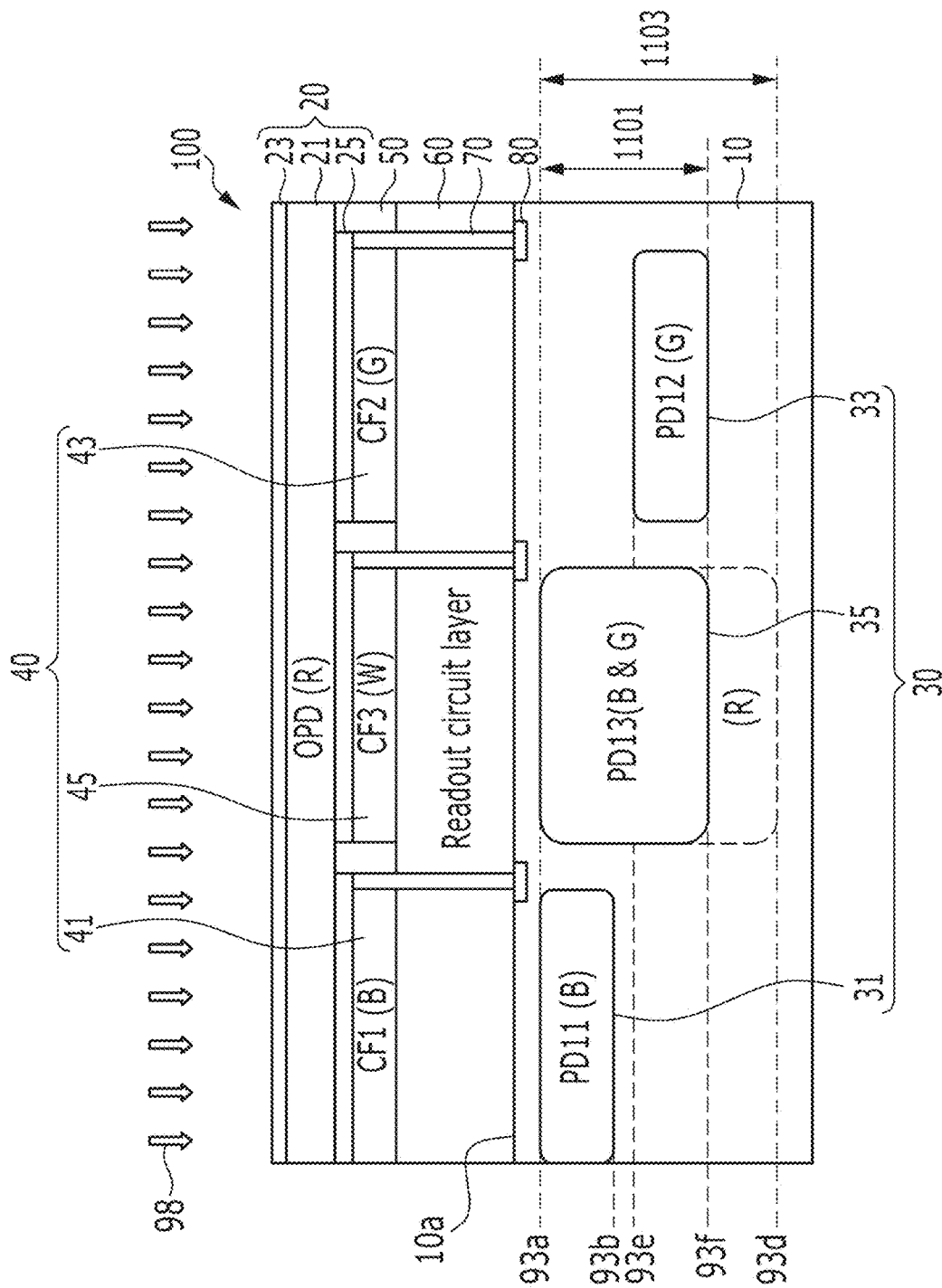
FIG. 11 is a cross-sectional view showing an image sensor according to further some example embodiments.
Figure 12:
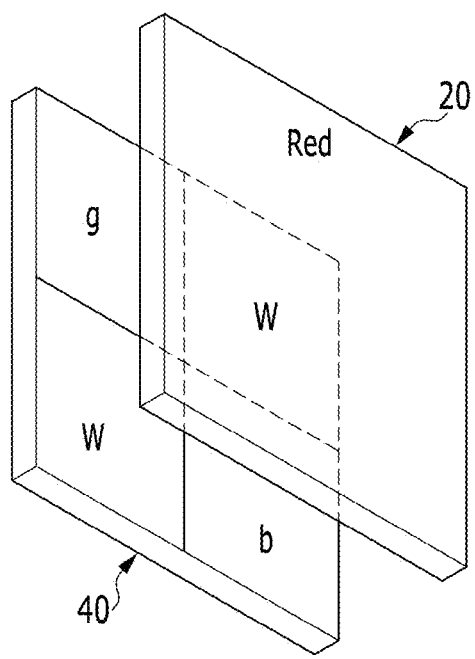
FIG. 12, FIG. 13, FIG. 14, and FIG. 15 are schematic views showing various examples for color filter arrays of an image sensor according to further some example embodiments.
Figure 13:
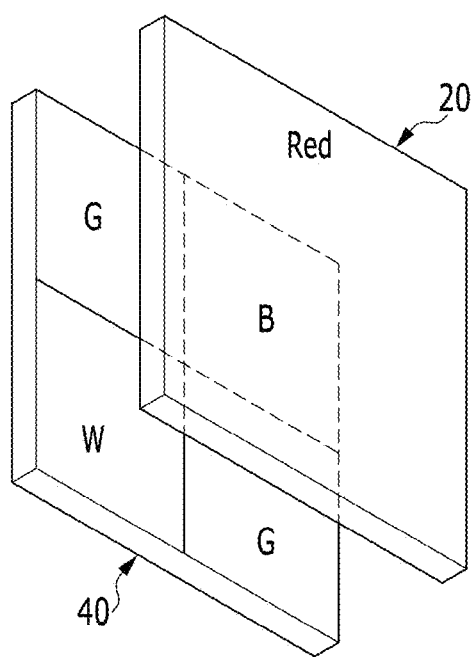
Figure 14:
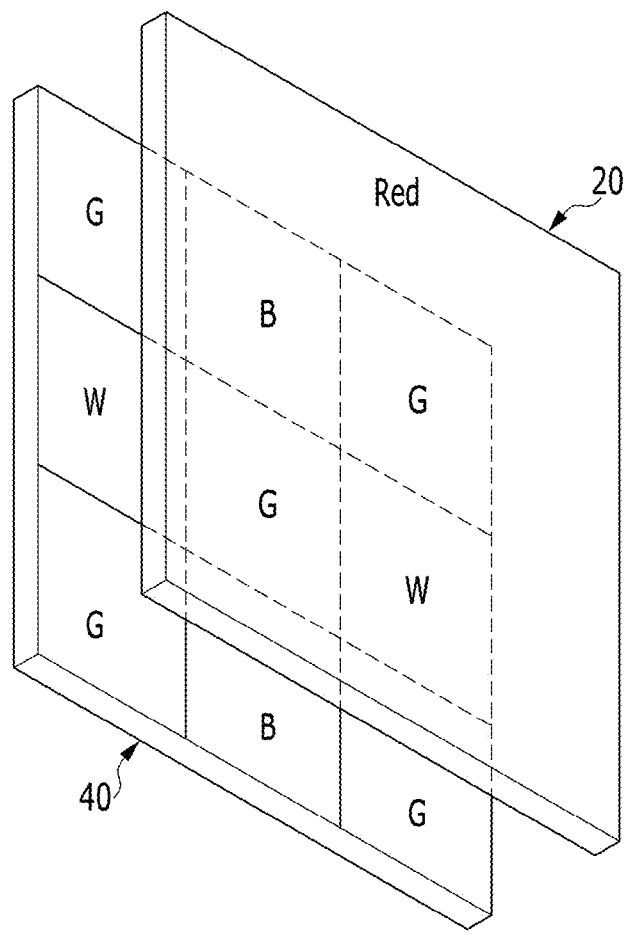
Figure 15:
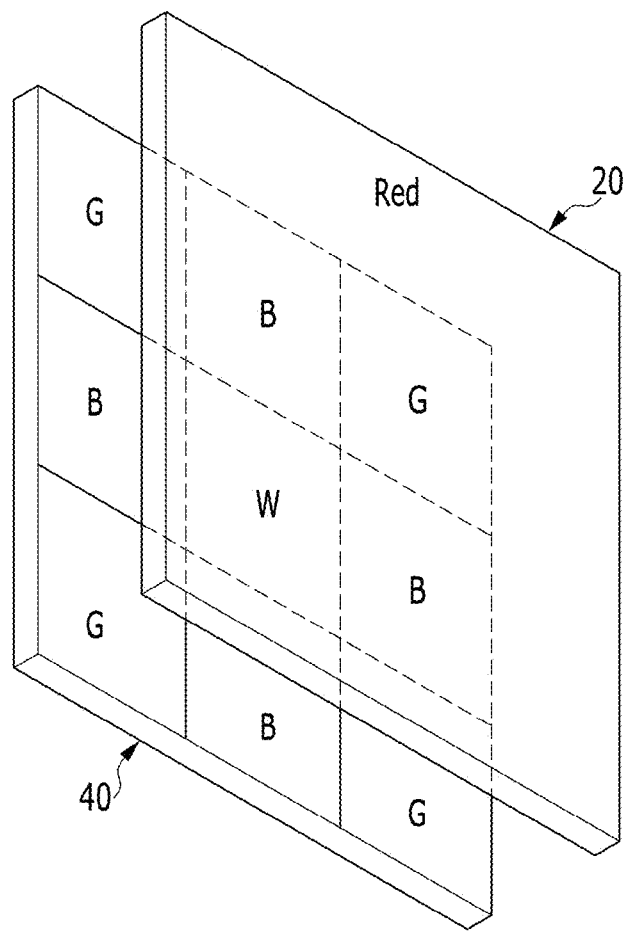

FIG. 11 is a cross-sectional view showing an image sensor according to further some example embodiments when the first visible light sensed by the organic photo-sensing device 20 is a red light.

When the first visible light is a red light, a first photo-sensing device PD11(B), 31 for the photo-sensing device array 30 is formed to sense a blue light, a second photo-sensing device PD12(G), 33 is formed to sense a green light, and a third photo-sensing device PD13(B&G), 35 is formed to sense a mixed light of blue and green.

The first photo-sensing device 31 absorbing blue light is formed such that the first photo-sensing device 31 is located within the substrate 10 at a depth 97 from upper surface 10a that is centered at a depth of about 1 μm from the upper surface of the semiconductor substrate 10 and is thus located between depths 93a and 93b, and the second photo-sensing device 33 absorbing green light is formed such that the second photo-sensing device 33 is located within the substrate 10 at a depth 97 from upper surface 10a that is centered at a depth of about 2.5 μm and is thus located between depths 93e and 93f.

The third photo-sensing device 35 absorbing the mixed light may be formed such that the third photo-sensing device 35 is located within the substrate 10 at a depth 97 from upper surface 10a that extends from the blue light absorption region (e.g., depth 93a) to the green light absorption region (e.g., depth 93f). Thus, the third photo-sensing device 35 at least partially extends between the different depths 97 at which photo-sensing devices 31 and 33 are located in the substrate 10.

If required, the third photo-sensing device 35 absorbing the mixed color may be formed to be extended in thickness from 1101 to 1103 until the red light absorption region (dotted line portion) such that the third photo-sensing device 35 extends between depths 93a and 93d.

The color filter array 40 may have a variety of matrix such as 2×2, 3×3 and the like, as shown in FIGS. 12 to 15, and the color filter array 40 is corresponded to the photo-sensing device array 30.

Referring to FIGS. 12 to 15, the number of the blue filter B is same as the number of the green filter G in the color filter array 40, or the number of the green filter G is greater than the number of the blue filter (B).

A white color filter W transmitting a mixed light of green and red may be disposed in the other regions. As long as satisfying the conditions, the alignments shown in FIG. 12 to FIG. 15 may be variously changed.

The total number of the white color filter W transmitting a mixed light may be same as or less than the total number of other single color filters B, G.

The blue filter B may selectively transmit a blue light having a maximum absorption wavelength ($\lambda_{max}$) at greater than or equal to about 400 nm and less than about 500 nm.

The green filter G may selectively transmit a green light having a maximum absorption wavelength ($\lambda_{max}$) at about 500 nm to about 600 nm.

FIGS. 12 to 15 exemplify a white color filter W, but a cyan (Cy) filter blocking red absorbed by the organic photo-sensing device 20 and selectively transmitting cyan light which is a complementary color to red.

Figure 16:
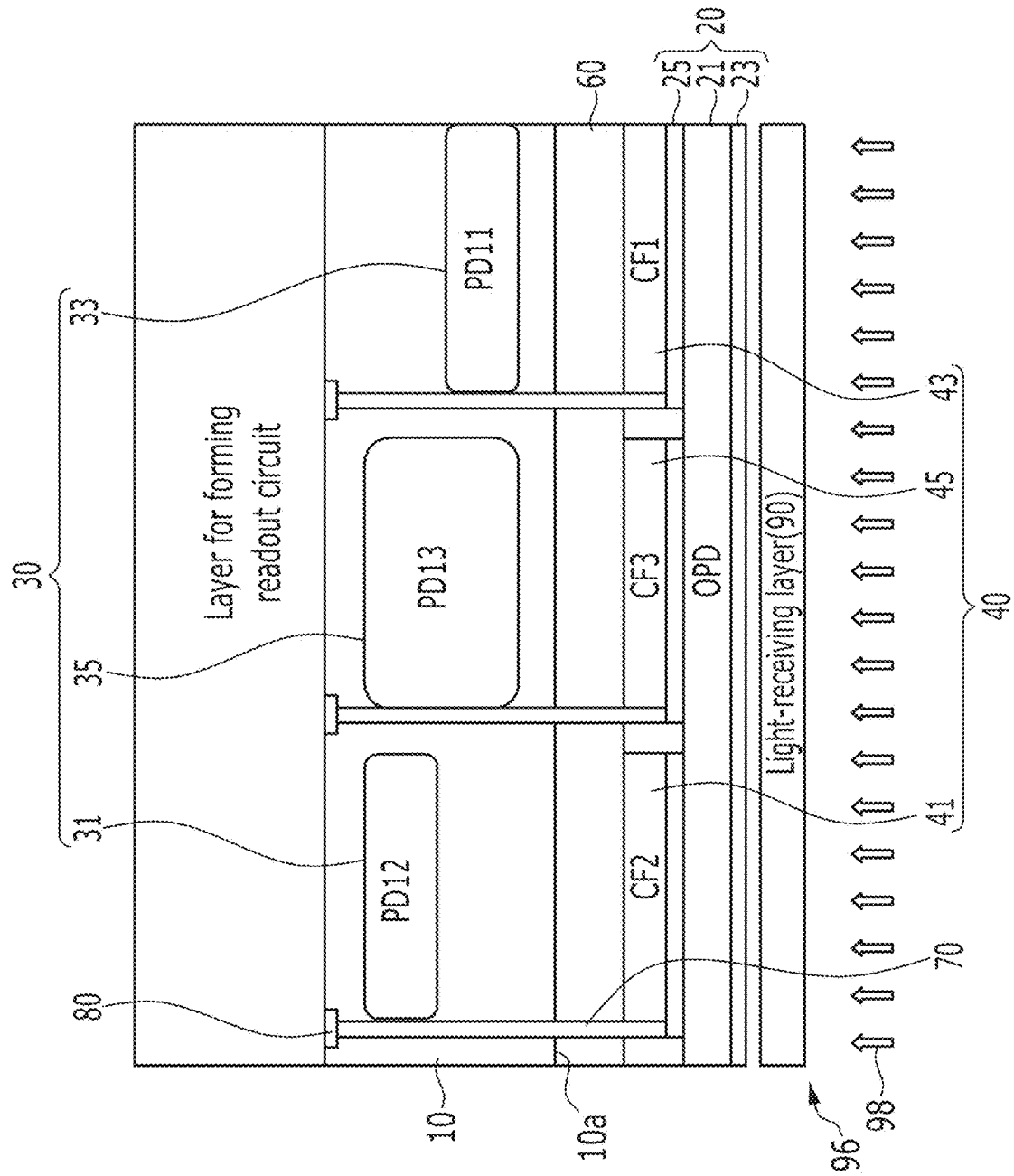
FIG. 16 is a cross-sectional view of an image sensor according to yet further some example embodiments.

FIG. 16 is a cross-sectional view of an image sensor according to yet further some example embodiments.

FIG. 16 shows a backside illuminated image sensor in which a light receiving layer 90 and a readout layer 95 are disposed on opposite surfaces to each other of the substrate 10 unlike the front-side illuminated image sensors shown in FIGS. 1, 6, and 11.

The photo-sensing device is a two-layered image sensor, and the alignment of the organic photo-sensing device 20 and the photo-sensing device array 30 and the alignment of the color filter array 40 interposed therebetween may be realized in the same manners as in the various embodiments shown in FIGS. 1 to 15.

Figure 17:
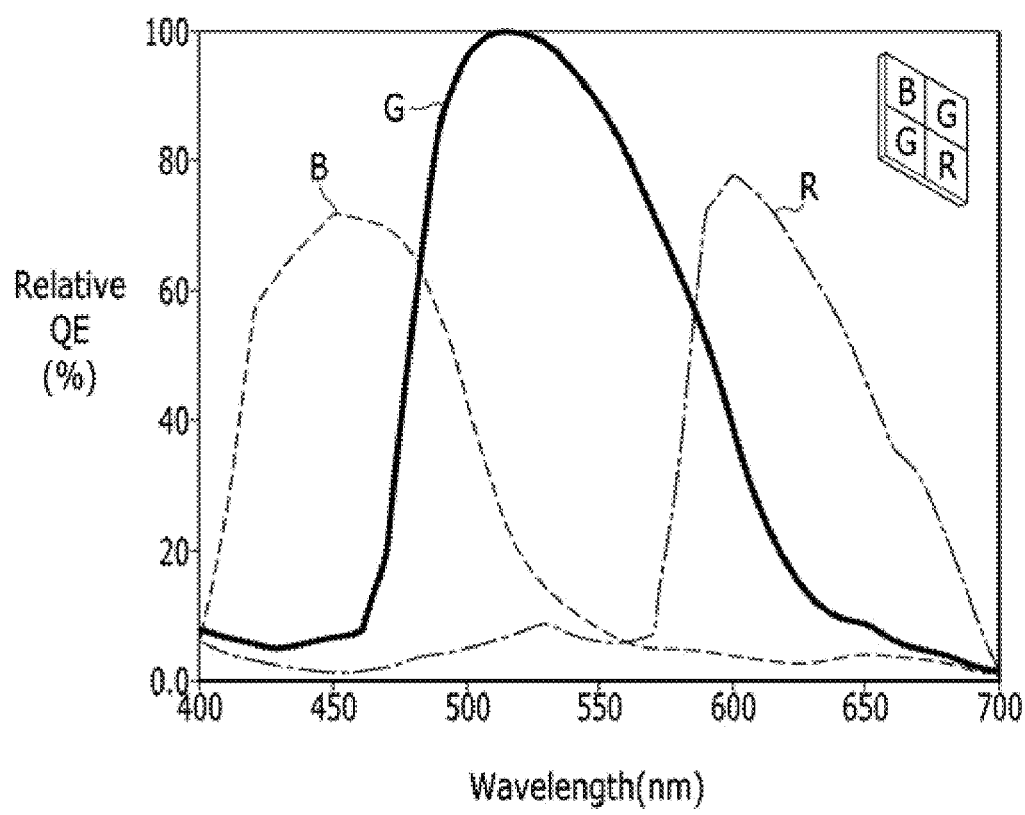
FIG. 17 is a graph showing a spectral transmittance of an image sensor having a Bayer pattern of the conventional single-layered structure.
Figure 18:
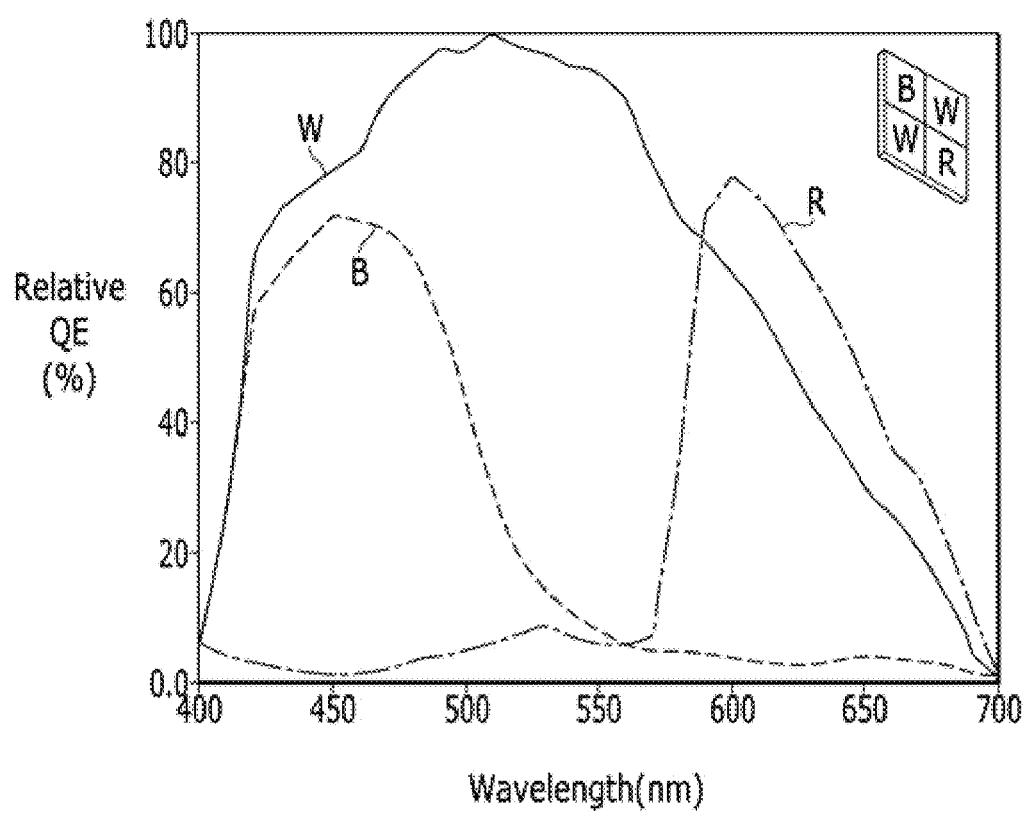
FIG. 18 is a graph showing a spectral transmittance of an image sensor including a white filter instead of a green filter in Bayer pattern of the conventional single-layered structure.
Figure 19:
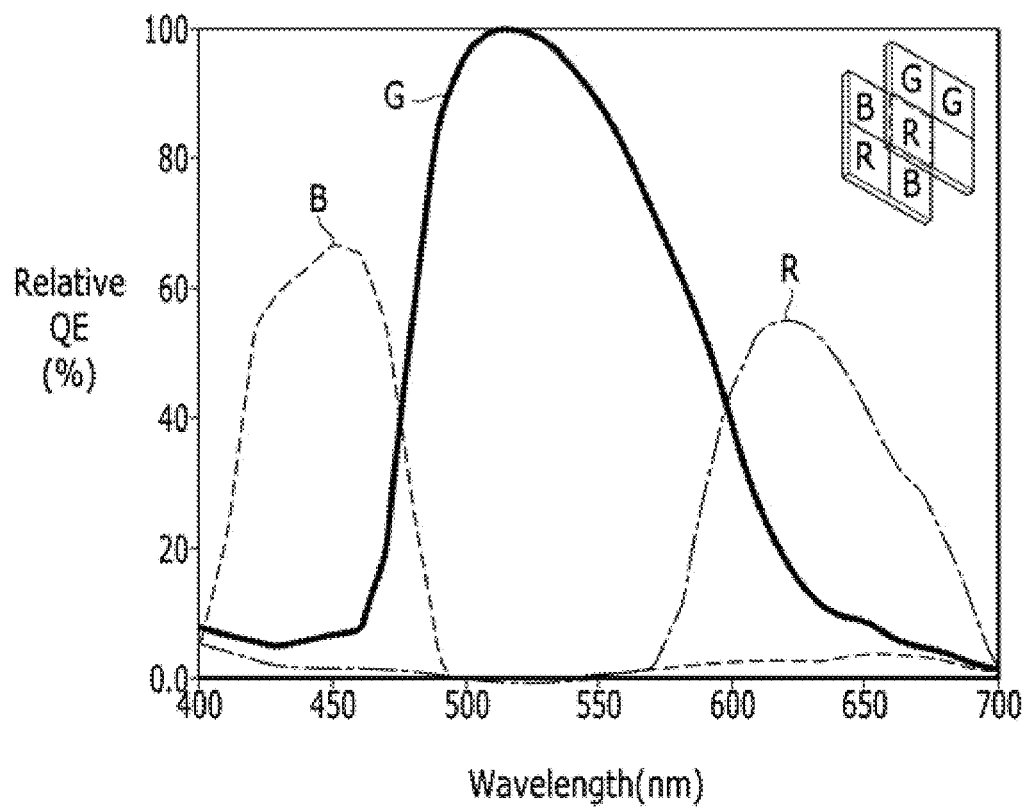
FIG. 19 is a graph showing a spectral transmittance of an image sensor having the conventional two-layered structure.
Figure 20:
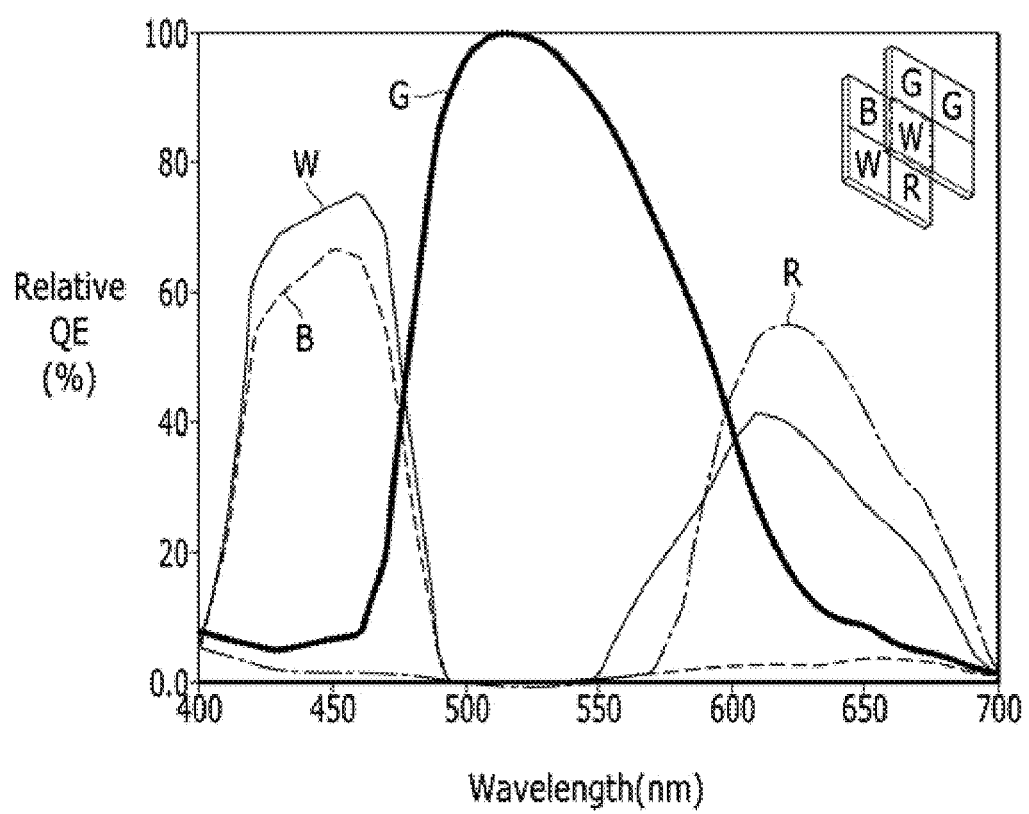
FIG. 20 is a graph showing a spectral transmittance of an image sensor according to some example embodiments.

FIG. 17 is a graph showing a spectral transmittance of the image sensor having the conventional single layer structure of a Bayer pattern; FIG. 18 is a graph showing a spectral transmittance of the image sensor including a white color filter instead of the green filter in the Bayer pattern of the conventional single layer structure; FIG. 19 is a graph showing a spectral transmittance of the image having the conventional two-layered structure; and FIG. 20 is a graph showing a spectral transmittance of the image sensor according to some example embodiments.

At the right and up side of each graph, the color filter array is also shown.

In each graph, R refers to a spectral transmittance by the red filter; G refers to a spectral transmittance by the green filter; B refers to a spectral transmittance by the blue filter; and W refers to a spectral transmittance by the white color filter.

Table 1 shows the results of calculating the relative light absorption utilization efficiency based on each transmittance shown in the graphs of FIGS. 17 to 20.

Supposing that the transmitted light is absorbed and photoelectrically converted in 100%, the spectral transmittance is calculated, and supposing the light utilization efficiency shown in FIG. 17 is 1, the light utilization efficiency is calculated.

TABLE 1

|  | B | G (or W) | R | +W | Total | Light utilization efficiency increase |
|---|---|---|---|---|---|---|
| FIG. 17 | 73 | 237 | 67 |  | 376 | 1.00 |
| FIG. 18 | 73 | 385 | 67 |  | 525 | 1.39 |
| FIG. 19 | 87 | 473 | 90 |  | 651 | 1.73 |
| FIG. 20 | 44 | 473 | 45 | 159 | 721 | 1.92 |

Referring to Table 1, it is understood that the image sensor according to some example embodiments shown in FIG. 20 increases the light absorption efficiency in greater than or equal to almost two times relative to the image sensor having the conventional single layer structure of a Bayer pattern, and thus enabling improved performance of the image sensor according to some example embodiments and/or improved performance of an electronic device including the image sensor of some example embodiments.

In addition, the light absorption efficiency of the image sensor according to some example embodiments is improved in greater than or equal to about 12% relative to that of the image sensor having the conventional two-layered structure. As a result, image sensors and electronic devices including same are expected to show ("exhibit") a much improved performance and thus functionality.

This is because the image sensor according to some example embodiments may have improved sensitivity based on providing a white color filter and a photo-sensing device capable of receiving a white light under the same and by absorbing the whole light remained after being absorbed by the organic photo-sensing device.

Figure 21:
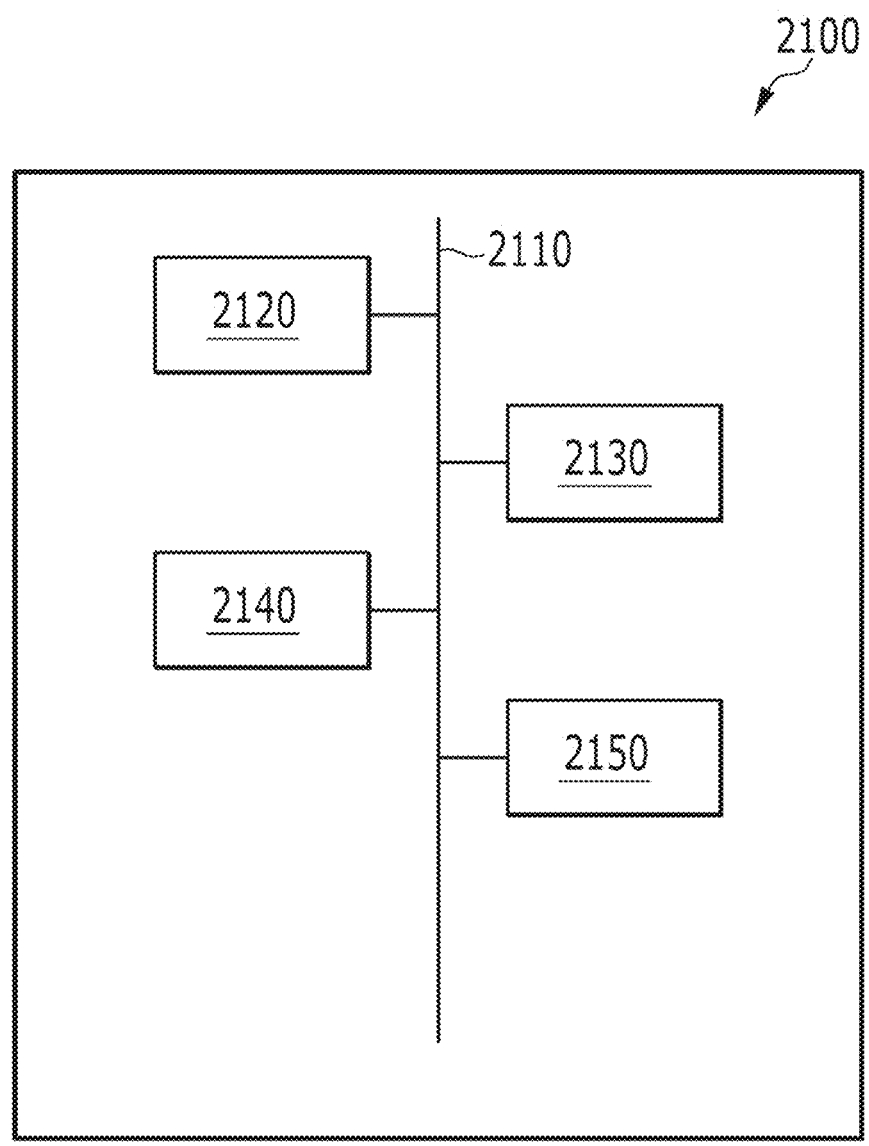
FIG. 21 is a diagram illustrating an electronic device according to some example embodiments.

FIG. 21 is a diagram illustrating an electronic device 2100 according to some example embodiments.

Referring to FIG. 21, the electronic device 2100 includes a memory 2120, a processor 2130, a device 2140, and a communication interface 2150. The device 2140 may include any of the image sensors illustrated and described herein, including image sensor 100, image sensor 2200, some combination thereof, or the like.

The electronic device 2100 may be included in one or more various electronic devices, including, for example, a mobile phone, a digital camera, a sensor device, a biosensor device, and the like. In some example embodiments, the electronic device 2100 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 2120, the processor 2130, the device 2140, and the communication interface 2150 may communicate with one another through a bus 2110.

The communication interface 2150 may communicate data from an external device using various Internet protocols. The external device may include, for example, an image providing server, a display device, a mobile device such as, a mobile phone, a smartphone, a personal digital assistant (PDA), tablet computer, and a laptop computer, a computing device such as a personal computer (PC), a tablet PC, and a netbook, an image outputting device such as a TV and a smart TV, and an image capturing device such as a camera and a camcorder.

The processor 2130 may execute a program and control the electronic device 2100. A program code to be executed by the processor 2130 may be stored in the memory 2120. An electronic system may be connected to an external device through an input/output device (not shown) and exchange data with the external device.

The memory 2120 may store information. The memory 2120 may be a volatile or a nonvolatile memory. The memory 2120 may be a non-transitory computer readable storage medium. The memory may store computer-readable instructions that, when executed, cause the execution of one or more methods, functions, processes, etc. as described herein. In some example embodiments, the processor 2130 may execute one or more of the computer-readable instructions stored at the memory 2120.

In some example embodiments, the communication interface 2150 may include a USB and/or HDMI interface. In some example embodiments, the communication interface 2150 may include a wireless communication interface.

Figure 22:
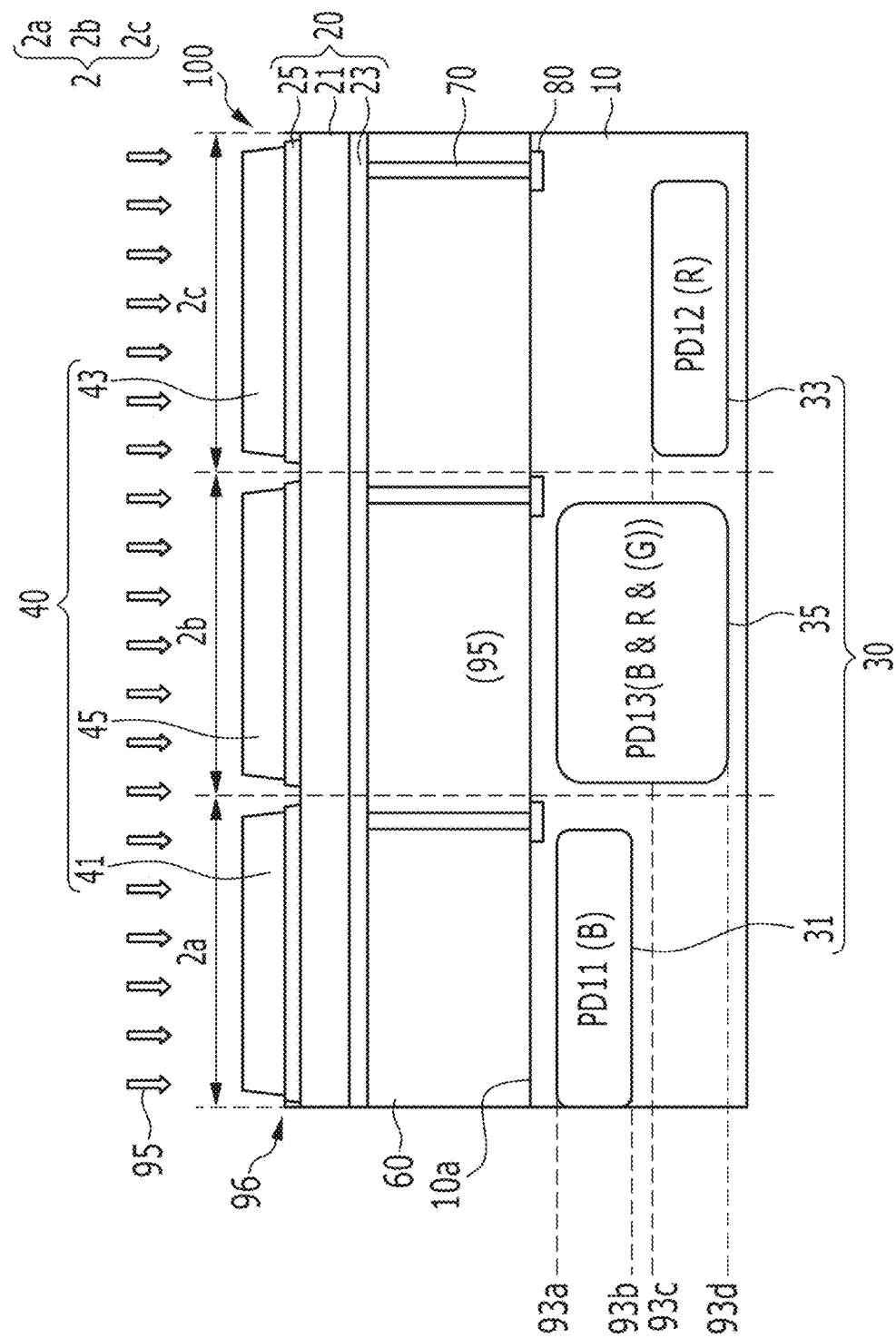
FIG. 22 is a cross-sectional view of an image sensor according to some example embodiments.

FIG. 22 is a cross-sectional view of an image sensor according to some example embodiments.

FIG. 21 includes elements having common reference labels as elements shown in FIG. 1; to the extent that these elements in FIG. 22 are the same as elements shown in FIG. 1, the elements are not further described in detail and the description of the elements as shown in FIG. 1 is incorporated into the description of the elements in FIG. 22.

In some example embodiments, an image sensor 2200 includes the substrate 10 in which the photo-sensing device array 30 is integrated, an organic photo-sensing device 20, and a color filter array 40.

In some example embodiments, as shown in FIG. 22, the color filter array 40 may be on the organic photo-sensing device 20 and distal from the photo-sensing device array 30, such that the organic photo-sensing device 20 is between the color filter array 40 and the photo-sensing device array 30. As shown in FIG. 22, the color filters 41, 43, 45 of the color filter array 40 may be formed on upper surfaces 25a of the second electrodes and an upper surface 21a of the organic photoelectric conversion layer 21.

In some example embodiments, one or more color filters 41, 43, 45 of the color filter array 40 may be configured to selectively transmit a wavelength spectrum of mixed light of at least two colors out of three primary colors (e.g., red light, blue light, and/or green light). The mixed wavelength spectra of light selectively transmitted by each of the color filters 41, 43, 45 may include a wavelength spectrum of light that the one or more photo-sensing devices 31, 33, 35 is configured to selectively absorb ("sense").

For example, in the example embodiments shown in FIG. 22, the organic photoelectric conversion layer 21 may be configured to selectively absorb a first wavelength spectrum of visible light, and the color filter 41 may be configured to selectively pass light in a first mixed wavelength spectrum (hereinafter, referred to "first mixed light") that is different from the first visible light but includes the first wavelength spectrum of visible light, and the color filter 43 may be configured to selectively pass light in a second mixed wavelength spectrum (hereinafter, referred to "second mixed light") that is different from the first visible light and the first mixed light but includes the first wavelength spectrum of visible light.

The first mixed light and the second mixed light may each be a different mixed light of at least two selected from blue light, green light, and red light. For example, mixed light of blue light and green light may be cyan light, mixed light of red light and green light may be yellow light, and mixed light of red light and blue light may be magenta light, and mixed light of red light, blue light, and green light may be white light. A color filter configured to selectively transmit mixed light may thus be configured to selectively transmit one light (wavelength spectrum of light) of cyan light, yellow light, magenta light, or white light.

For example, in the example embodiments shown in FIG. 22, if and/or when the organic photoelectric conversion layer 21 is configured to selectively absorb ("sense") green light, the color filter 41 may be a cyan filter that is configured to selectively transmit cyan light (a first mixed light of blue light and green light) and the color filter 43 may be a yellow filter that is configured to selectively transmit yellow light (a second, different mixed light of red light and green light). Photo-sensing device 31 may sense the blue light that passes from color filter 41 and through the organic photo-sensing device 20 while the green light passing from the color filter 41 is absorbed by the organic photoelectric conversion layer 21 of the organic photo-sensing device 20. Photo-sensing device 33 may sense the red light that passes from color filter 43 and through the organic photo-sensing device 20 while the green light passing from the color filter 43 is absorbed by the organic photoelectric conversion layer 21 of the organic photo-sensing device 20.

In some example embodiments, including the example embodiments shown in FIG. 22, adjacent color filters 41, 43, 45 in adjacent pixels 2 may be configured to selectively transmit different wavelength spectra of mixed light. In some example embodiments, including the example embodiments shown in FIG. 22, adjacent photo-sensing devices 31, 33, 35 in adjacent pixels 2 may be configured to sense different wavelength spectra of light. For example, color filter 41 may be a cyan filter (i.e., configured to selectively transmit cyan light) and color filter 43 may be a yellow filter (i.e., configured to selectively transmit yellow light), while photo-sensing device 31 may be a blue photo-sensing device (i.e., configured to sense blue light) and photo-sensing device 33 may be a red photo-sensing device (i.e., configured to sense red light). Thus, if and/or when the organic photoelectric conversion layer 21 is configured to selectively absorb light in one wavelength spectrum of light (e.g., green light), adjacent color filters 41, 43, 45 of the color filter array 40 may be configured to selectively transmit different wavelength spectra of mixed light of a plurality of wavelength spectra of mixed light, the different wavelength spectra of mixed light including both the one wavelength spectrum of light (e.g., green light) and different additional wavelength spectra of light, respectively (e.g., blue or red light).

While both the second insulation layer 60 is shown in FIG. 22, it will be understood that, in some example embodiments of the image sensor 2200, the second insulation layer 60 is omitted.

In some example embodiments, the color filter array 40 may be omitted, and each photo-sensing device 31, 33, 35 may be configured to selectively absorb ("sense") a particular limited wavelength spectrum of light, of the entire wavelength spectrum of light that is received at the respective photo-sensing device 31, 33, 35.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

<Description of symbols>

| | |
|---|---|
| 10: semiconductor substrate | 20: organic photo-sensing device |
| 30: photo-sensing device array | 40: color filter array |

What is claimed is:

1. An image sensor, comprising:
   a repeating assembly of a plurality of photo-sensing devices, wherein the repeating assembly includes
      an organic photo-sensing device configured to selectively sense a first wavelength spectrum of visible light, and
      a photo-sensing device array including
         at least one first photo-sensing device configured to selectively sense a second wavelength spectrum of visible light,
         at least one second photo-sensing device configured to selectively sense a third wavelength spectrum of visible light, and
         at least one third photo-sensing device configured to selectively sense a mixed wavelength spectrum of light of the second wavelength spectrum of visible light and the third wavelength spectrum of visible light; and
   a color filter array including
      at least one first color filter between the organic photo-sensing device and the at least one first photo-sensing device and configured to selectively transmit the second wavelength spectrum of visible light,
      at least one second color filter between the organic photo-sensing device and the at least one second photo-sensing device and configured to selectively transmit the third wavelength spectrum of visible light, and
      at least one third color filter between the organic photo-sensing device and the at least one third photo-sensing device and configured to transmit the mixed wavelength spectrum of light of the second wavelength spectrum of visible light and the third wavelength spectrum of visible light,
   wherein the at least one third photo-sensing device extends from a depth in a substrate associated with an absorption region of the second wavelength spectrum of visible light to a separate depth in the substrate associated with an absorption region of the third wavelength spectrum of visible light,
   wherein a length of the at least one third photo-sensing device is different from lengths of the at least one first photo-sensing device and the at least one second photo-sensing device,
   wherein a depth in the substrate of an upper surface of the at least one first photo-sensing device is a first depth, and a depth in the substrate of a bottom surface of the at least one first photo-sensing device is a second depth, such that the at least one first photo-sensing device extends between the first depth and the second depth in the substrate,
   wherein a depth in the substrate of an upper surface of the at least one second photo-sensing device is a third depth, and a depth in the substrate of a bottom surface of the at least one second photo-sensing device is a fourth depth, such that the at least one second photo-sensing device extends between the third depth and the fourth depth in the substrate,
   wherein the third depth is a greater depth in the substrate than the second depth, and the at least one third photo-sensing device extends between the first depth and the fourth depth in the substrate, including extending between the second depth and the third depth.

2. The image sensor of claim 1, wherein the third color filter is a complementary color filter of the first wavelength spectrum of visible light.

3. The image sensor of claim 1, wherein the third color filter is a white color filter.

4. The image sensor of claim 3, wherein a quantity of filters of the at least one third color filter is equal to or fewer than a total quantity of filters of the first color filter and the second color filter.

5. The image sensor of claim 4, wherein
the first wavelength spectrum of visible light is green light, and
the photo-sensing device array includes common quantifies of first photo-sensing devices and second photo-sensing devices.

6. The image sensor of claim 4, wherein the first wavelength spectrum of visible light is blue light or red light, and
the at least one first photo-sensing device and the at least one second photo-sensing device have different depths in the substrate.

7. The image sensor of claim 1, wherein the at least one third photo-sensing device is configured to absorb the first wavelength spectrum of visible light.

8. The image sensor of claim 1, wherein the at least one first photo-sensing device and the at least one second photo-sensing device are at different depths in the substrate.

9. The image sensor of claim 1, wherein the image sensor includes a readout circuit layer and a light-receiving layer on one surface of the substrate.

10. The image sensor of claim 1, wherein the image sensor includes a readout circuit layer and a light-receiving layer on opposite surfaces of the substrate.

11. An electronic device, comprising:
the image sensor of claim 1.

12. An image sensor, comprising:
an organic photo-sensing device configured to selectively sense a first wavelength spectrum of visible light; and
a photo-sensing device array including
at least one first photo-sensing device configured to selectively sense a second wavelength spectrum of visible light,
at least one second photo-sensing device configured to selectively sense a third wavelength spectrum of visible light, and
at least one third photo-sensing device configured to selectively sense a mixed wavelength spectrum of light of at least the first wavelength spectrum of visible light and at least one wavelength spectrum of visible light of the second wavelength spectrum of visible light and the third wavelength spectrum of visible light,
wherein the at least one third photo-sensing device extends from a depth in a substrate associated with an absorption region of the second wavelength spectrum of visible light to a separate depth in the substrate associated with an absorption region of the third wavelength spectrum of visible light,
wherein a length of the at least one third photo-sensing device is different from lengths of the at least one first photo-sensing device and the at least one second photo-sensing device,
wherein a depth in the substrate of an upper surface of the at least one first photo-sensing device is a first depth, and a depth in the substrate of a bottom surface of the at least one first photo-sensing device is a second depth, such that the at least one first photo-sensing device extends between the first depth and the second depth in the substrate,
wherein a depth in the substrate of an upper surface of the at least one second photo-sensing device is a third depth, and a depth in the substrate of a bottom surface of the at least one second photo-sensing device is a fourth depth, such that the at least one second photo-sensing device extends between the third depth and the fourth depth in the substrate,
wherein the third depth is a greater depth in the substrate than the second depth, and the at least one third photo-sensing device extends between the first depth and the fourth depth in the substrate, including extending between the second depth and the third depth.

13. The image sensor of claim 12, further comprising:
a color filter array including
at least one first color filter configured to selectively transmit the second wavelength spectrum of visible light,
at least one second color filter configured to selectively transmit the third wavelength spectrum of visible light, and
at least one third color filter configured to transmit the mixed wavelength spectrum of light of the second wavelength spectrum of visible light and the third wavelength spectrum of visible light.

14. The image sensor of claim 13, wherein the organic photo-sensing device is between the color filter array and the photo-sensing device array.

* * * * *